US012689345B2

(12) United States Patent
Kyrannis

(10) Patent No.: US 12,689,345 B2
(45) Date of Patent: Jul. 21, 2026

(54) AUDIO PROCESSING

(71) Applicant: Blackmagic Design Pty Ltd, South Melbourne (AU)

(72) Inventor: Michael Paris Kyrannis, Altona North (AU)

(73) Assignee: Blackmagic Design Pty Ltd, South Melbourne (AU)

( * ) Notice: Subject to any disclaimer, the term of this patent is extended or adjusted under 35 U.S.C. 154(b) by 138 days.

(21) Appl. No.: 18/584,622

(22) Filed: Feb. 22, 2024

(65) Prior Publication Data

US 2024/0291455 A1 Aug. 29, 2024

Related U.S. Application Data

(60) Provisional application No. 63/486,664, filed on Feb. 23, 2023.

(51) Int. Cl.
*H03G 3/30* (2006.01)
*H03G 3/00* (2006.01)

(52) U.S. Cl.
CPC .......... *H03G 3/3089* (2013.01); *H03G 3/001* (2013.01)

(58) Field of Classification Search
CPC .... H03G 3/3089; H03G 3/001; H03G 3/3005; H03G 3/3026; H03F 3/183; H03F 3/45475; H03F 3/181; H03F 2200/03; H03M 1/188; H03M 1/12
USPC .......................................... 381/104–109, 123
See application file for complete search history.

(56) References Cited

U.S. PATENT DOCUMENTS

| | | | | | |
|---|---|---|---|---|---|
| 5,852,769 | A * | 12/1998 | Ahmed | H04M 1/6008 455/116 |
| 8,259,877 | B2 * | 9/2012 | Demol | H03G 3/3068 375/345 |
| 10,855,308 | B2 * | 12/2020 | Perrott | H03M 3/376 |
| 12,136,904 | B2 * | 11/2024 | Valle | H03G 3/3005 |
| 2014/0376748 | A1 | 12/2014 | Okabayashi et al. | |
| 2017/0033754 | A1 * | 2/2017 | Perrott | H04H 60/04 |
| 2018/0063644 | A1 | 3/2018 | Bach et al. | |
| 2018/0138882 | A1 * | 5/2018 | Kim | H03G 3/3005 |

FOREIGN PATENT DOCUMENTS

CN 113114261 A 7/2021

OTHER PUBLICATIONS

Wolfson Microelectronics “WM8737L Stereo ADS with Microphone Preamplifier”, XP-002475365, Advanced Information, May 2004, Rev 3.0, www.wolfsonmicro.com, 36 pages.
Pearson, C. “High-Speed, Analog-to-Digital Converter Basics”, Application Report SLAA510—Jan. 2011, Texas Instruments, 26 pages.
Extended European Search Report for EP 24159450.6 dated Jun. 24, 2024, 10 pages.

* cited by examiner

*Primary Examiner* — Xu Mei
(74) *Attorney, Agent, or Firm* — Seed Intellectual Property Law Group LLP

(57) ABSTRACT

An audio processing system has, at an input for receiving a balanced analog audio signal, an analog amplification stage having a first fixed gain and a first dynamic range. The system further includes an analog to digital conversion stage, having a second dynamic range that matches said first dynamic range of the analog amplification stage. A digital gain stage can also be provided to allow user selectable gain.

26 Claims, 16 Drawing Sheets

90

| | Max input level | DNR | Noise floor | Gain required for DNR | Attenuation | Parallel ADCs | Effective DNR |
|---|---|---|---|---|---|---|---|
| 91→ | +14dBu | 141 | -128dBu | +4dB | -9dB | 64 | 141 |
| 92→ | +11dBu | 138 | -128dBu | +7dB | -9dB | 32 | 138 |
| 93→ | +7dBu | 135 | -128dBu | +10dB | -9dB | 16 | 135 |
| 94→ | +4dBu | 132 | -128dBu | +13dB | -9dB | 8 | 132 |
| 95→ | +1dBu | 129 | -128dBu | +16dB | -9dB | 4 | 129 |

AUDIO PROCESSING

CROSS REFERENCE TO RELATED APPLICATION

This application claims priority to and the benefit of U.S. Provisional Patent Application No. 63/486,664 filed on 23 Feb. 2023, the disclosure of which is incorporated, in its entirety, by reference.

BACKGROUND

Technical Field

The present disclosure relates to audio processing. The illustrative embodiments relate to apparatus to amplify audio signals. In one form the apparatus is described as a preamplifier adapted to receive an analog signal from a microphone or other source.

Description of the Related Art

FIG. 1 is a schematic block diagram illustrating a conventional preamplifier channel 10.

The preamp 10 comprises an input 12 that receives an analog signal representing an audio signal from a transducer (not shown). The transducer may be, for example a microphone or pickup from an electric musical instrument, signal generator, or the like.

The input 12 is connected to an attenuator 14. The attenuator 14 provides a fixed reduction in input signal, e.g., a reduction of −20 dB. The attenuator 14 provides a mechanism to allow the system to cater for extra high input signal levels, from higher output phantom powered microphones or from an instrument or audio line level source.

In the embodiment of FIG. 1, an optional phantom power source 20 is also illustrated. The phantom power source 20 may be switchable in order to selectively power sources requiring input power.

Next the signal pair is provided to an analog preamp circuit 16. The preamp 16 enables variable gain to be applied to its input signal so as to handle a wide input signal level range. The gain of the preamp 16 is digitally controlled between 0 and +60 dB in discrete steps. Gain steps will typically be ±1 dB but some systems will use different step sizes (e.g., ±2 dB or ±3 dB). Steps of this size are convenient for a user, but are not ideal as this gain step size produces audible clicks during the gain transition, which can make a zipper-like noise if changes are made rapidly.

Next, in embodiments requiring a digital output, the analog differential signal pair is output from the preamp 16 and provided to the input of the ADC 18. The analog audio signals are digitized by the audio ADC. Typically high end differential input ADCs have a current maximum dynamic range of 123 dB, which works reasonably well for many applications. However, it does not fully capture the higher dynamic range actually present at many microphones.

FIG. 2 provides more detail of the preamplifier channel 10. Common features with FIG. 1 have been labelled with the same reference numerals and will not be described again for brevity. The preamplifier channel 10 of FIG. 2 shows more detail of the preamp circuit 16.

As can be seen, the preamp circuit's 16 structure is that of a differential amplifier. In this embodiment the differential amplifier structure includes a first op-amp 20 and a second op-amp 22. Each op-amp 20, 22 has a feedback resistor Rfb1 and Rfb2 respectively. For convenience, a resistor's name/reference (e.g., Rfb1, Rfb2, Rg) will also be used to as a pronumeral for said resistor's resistance value. Feedback resistors Rfb1 and Rfb2 and the inverting inputs of the op-amps 20, 22 are connected by resistor Rg. The gain of the preamp circuit 16 is determined by the total resistance of the resistor feedback path (Rg+Rfb1+Rfb2) divided by the resistance of Rg. As Rg becomes smaller in comparison to (Rg+Rfb1+Rfb2), the gain of the preamp increases and vice versa. Thus, one or more of Rg, or Rg and feedback resistors (Rfb1, Rfb2), can be altered to increase or reduce the overall gain of this differential preamp stage. This alteration is achieved by using a network of resistors and associated switching system to change the applied resistance accordingly.

However, as noted above, when the gain is stepped in ±1 dB increments audible clicks are produced due to the sudden change in the analog voltage level, producing a characteristic "zipper" noise. In theory this disadvantage can be ameliorated with use of smaller gain steps, but this increases the number of gain steps required, and consequently increases the number of resistors in the resistor network of the preamp circuit 16 and the complexity of switching system in line with the increased number of resistors. Thus, in reality this is an impractical and commercially unviable solution.

Moreover, such a differential amplifier structure typically favors high gain, as it has a lowest preamp input noise when "Rg" is at its lowest value. Consequently, lower gains result in a preamp having a higher input noise level which then also limits the signal path's dynamic range.

The systems, devices, methods and approaches described in this section, and components thereof are known to the inventors. Therefore, unless otherwise indicated, it should not be assumed that any of such systems, devices, methods, approaches or their components described are citable as prior art merely by virtue of their inclusion in this section, or that such systems, devices, methods, approaches and components would ordinarily be known to a person of ordinary skill in the art.

BRIEF SUMMARY

The various combinations of features set out in the appended claims will serve as a summary of various aspects of the disclosure.

While aspects of the invention(s) disclosed herein are amenable to various modifications and alternative forms, specific embodiments are shown by way of example in the drawings and are described in detail. It should be understood, however, that the drawings and detailed description are not intended to limit the invention(s) to the particular form disclosed. Furthermore, all alternative combinations of two or more of the individual features mentioned or evident from the text or drawings comprise additional aspects or inventive disclosures, which may form the subject of the claims.

In various embodiments, disclosed herein is an audio processing system comprising an input for receiving a balanced analog audio signal, an analog amplification stage having a first dynamic range and a first fixed gain between −11 dB and +10 dB, and an analog to digital conversion stage having a second dynamic range that matches said first dynamic range of the analog amplification stage. In some cases, the first fixed gain of the analog amplification stage is between −5 dB and +7 dB. In some cases, the first fixed gain of the analog amplification stage is between 4 dB and 5 dB. In some cases, the first fixed gain of the analog amplification stage is about 4 dB.

The analog to digital conversion stage may comprise a plurality of analog to digital converters (ADCs), each ADC having a third dynamic range that is lower than the second dynamic range. An output of the plurality of ADCs may be digitally averaged to provide a digital output with the second dynamic range.

The analog amplification stage may include an analog preamp stage having a second fixed gain and an analog attenuator stage having a third fixed gain. The second fixed gain and third fixed gain may combine to provide the first fixed gain.

In various embodiments, the audio processing system may further comprise a switchable attenuation stage between the input and the analog amplification stage. The switchable attenuation stage is switchable between an active state in which a fixed attenuation of an input signal is provided prior to the analog amplification stage and an inactive state in which the switchable attenuation stage provides no additional attenuation of the input signal prior to the analog amplification stage.

In various embodiments, the audio processing system may further comprise a digital gain stage configured to modify a digital output of the analog to digital conversion stage and apply a digital gain to the digital output from the analog to digital conversion stage. In some cases, the digital gain stage is configured to receive a user selected gain level and apply digital gain to the digital output of the analog to digital conversion stage according to the user selected gain level. In some cases, the digital gain stage is configured to receive a user selected gain level and apply digital gain to the digital output of the analog to digital conversion stage that matches the user selected gain level. In some cases, the digital gain stage is configured to receive a user selected gain level while operating at an initial digital gain level, and in response to receiving the user selected gain level, to vary a digital gain level applied to the digital output of the analog to digital conversion stage from said initial digital gain level to the user selected gain level. The digital gain stage may be configured to vary the digital gain level applied to the digital output of the analog to digital conversion stage from the initial digital gain level to the user selected gain level using any one or more of the following: predetermined gain steps; steps determined at least partly on the difference between the user selected gain level and the initial gain level; or a predetermined variation function.

The digital gain stage may be configured to receive a dynamically varying user selected gain level and apply digital gain to the digital output of the analog to digital conversion stage that follows the dynamically varying user selected gain level. In some cases, the digital gain stage includes an input device to receive the user selected gain level. The input device may comprise, for example, a rotary encoder, one or more buttons, a keyboard, a switch with two or more selectable positions, or a touchscreen adapted to display a gain selection user interface element.

The digital gain stage may be configured to adjust the digital gain applied to the digital output of the analog to digital conversion stage in steps less than 1 dB. In some cases, the digital gain stage is configured to adjust the digital gain applied to the digital output of the analog to digital conversion stage in steps more than 0.001 dB. In some cases, the digital gain stage is configured to adjust the digital gain applied to the digital output of the analog to digital conversion stage in steps smaller than 0.1 dB. In some cases, the digital gain stage is configured to adjust the digital gain applied to the digital output of the analog to digital conversion stage in steps larger than 0.005 dB. In some cases, the digital gain stage is configured to adjust the digital gain applied to the digital output of the analog to digital conversion stage in steps at or at about 0.01 dB.

In various embodiments, the input of the audio processing system comprises a connector for receiving a connection from a microphone.

In various embodiments, the audio processing system may further comprise a phantom power source connectable between the input and the analog amplification stage to power an input source.

In various embodiments, the audio processing system may comprise at least part of an audio processing system for a channel of a microphone preamplifier. In some cases, the audio processing system comprises at least part of the audio processing system for a channel of a multichannel microphone preamplifier.

Also disclosed is audio processing device that includes at least one audio processing system as described herein. The audio processing device may include a plurality of audio processing systems, wherein each audio processing system comprises an audio processing channel of the audio processing device. In some cases, the audio processing device may comprise a preamplifier adapted to receive an analog signal from any one or more of the following: a microphone, musical instrument, signal generator, or audio transducer.

DETAILED DESCRIPTION

In the following description, numerous specific details are set forth in order to provide a thorough understanding of the present disclosure. It will be apparent, however, that the present disclosure may be practiced without these specific details. In some instances, well-known structures and devices are shown in block diagram form in order to avoid unnecessary obfuscation of salient details.

Figure 1:
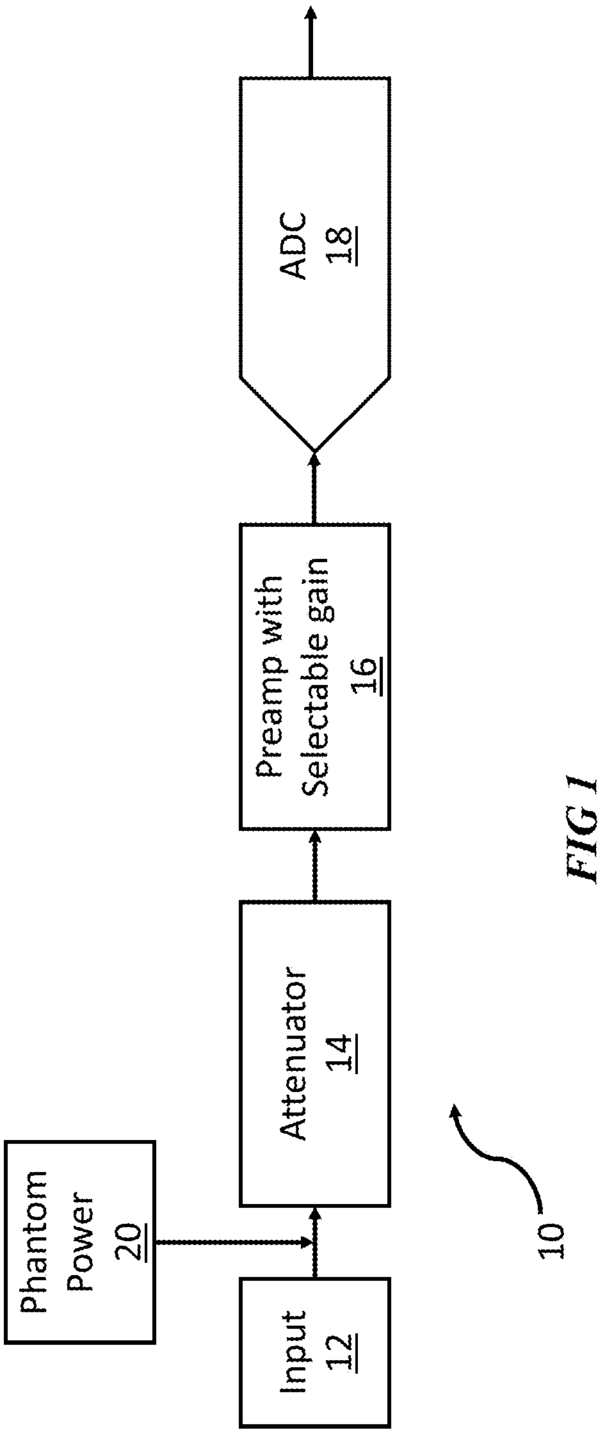
FIG. 1 is a schematic block diagram of an audio processing system.
Figure 2:
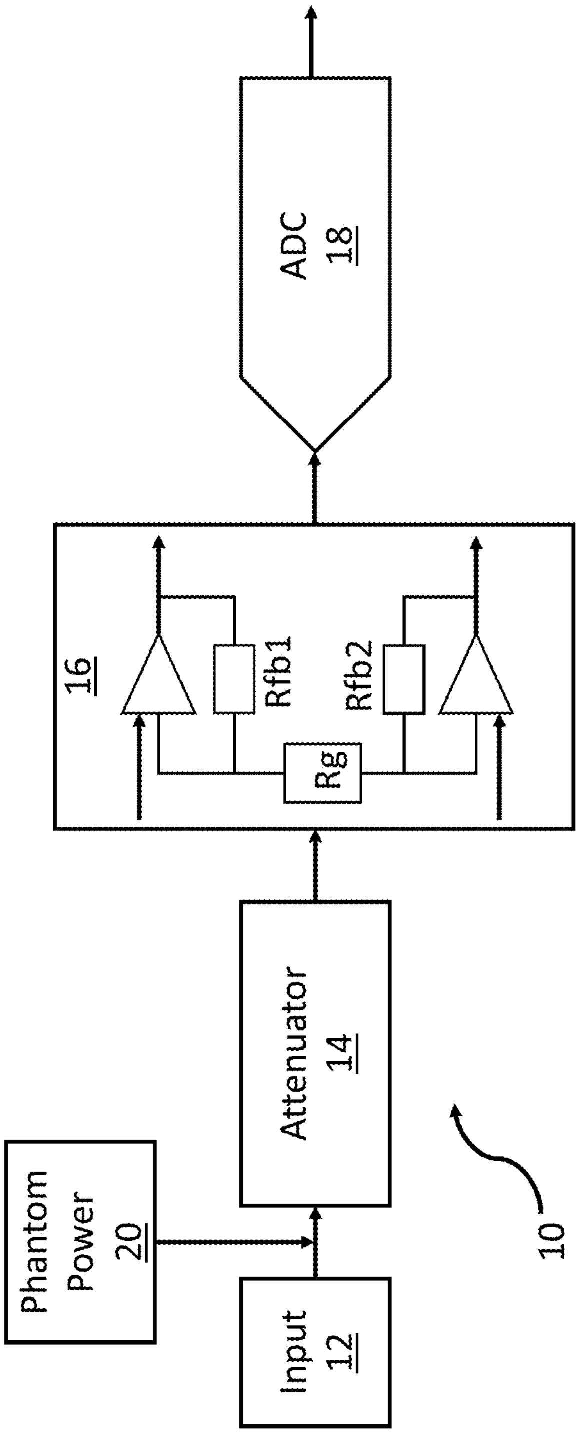
FIG. 2 is a schematic block diagram of the audio processing system of FIG. 1 with added detail.
Figure 3:
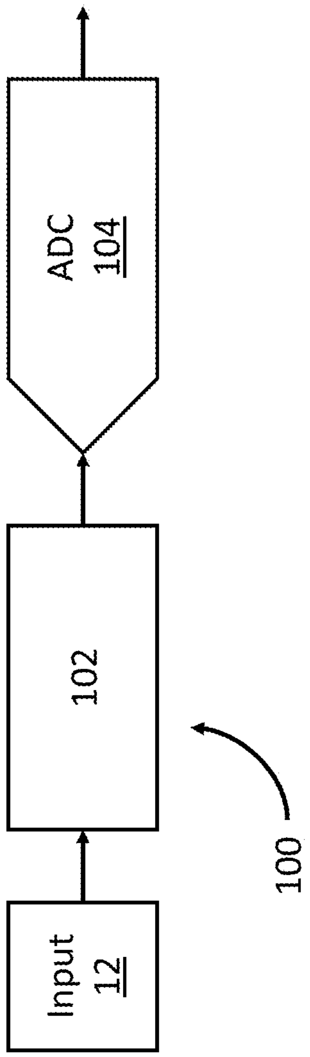
FIG. 3 is a schematic block diagram of an audio processing system of a first embodiment.

FIG. 3 is a schematic block diagram of an audio processing system according to an embodiment of the disclosure. The audio processing system 100 may be a preamplifier channel. For example, it may comprise the main functional elements of a standalone microphone preamplifier with digital output. The audio processing system 100 may form a subsystem of a more complex system or device, for example one of n preamplifier channels in an n-channel preamplifier with digital output, or a preamplifier stage for a channel of a digital sound processing system (having one or more channels). In one form, the audio processing system comprises a channel of a microphone preamplifier with a digital output. Multiple such preamplifier channels can be used in a multiple channel microphone preamplifier device. In another form, the audio processing system may comprise a channel of an audio analyzer or other metering or test equipment.

The audio processing system 100 includes an input 12 for receiving an audio signal. In this context, the "audio signal" is an electrical representation of a sound signal. The electrical representation of the sound signal is typically an analog modulation of a signal voltage. The sound signal may be synthesized (e.g., by an oscillator as in a synthesizer) or generated by a transducer (e.g., a pickup of a musical instrument or microphone). The input 12 may be configured to receive a balanced analog audio signal, e.g., by including two electrical input signal lines. Having an input with two input signal lines facilitates true differential signal amplification and also enables common mode noise rejection. In some embodiments, the input 12 may be a socket, jack or other connector to make connection with an input source, such as a microphone or musical instrument. In one example, the input may be a three pin XLR socket. An XLR socket provides two input signal lines to enable reception of a balanced input and facilitates the connection of a microphone for providing the input audio signal to be amplified. However, in the figures, connections to blocks that receive analog signals are illustrated diagrammatically with single lines, such connections may comprise pairs of lines so as to facilitate transmission of differential signal pairs.

The audio signal received at the input 12 is passed to an analog amplification stage 102. The analog amplification stage 102 has a fixed gain (the first fixed gain) and a dynamic range (the first dynamic range). Because the input signal is a differential signal, the analog gain stage can include a differential amplifier circuit with a fixed gain. The first fixed gain can be between about −11 dB and +10 dB. Some embodiments will have a first fixed gain between −5 dB and 7 dB. In one form, the first fixed gain will be between 3 dB and 6 dB. In the illustrative embodiment the first fixed gain will typically be about 4 dB and may be between 4 dB and 5 dB. The first dynamic range can be 132 dB.

Figure 6:
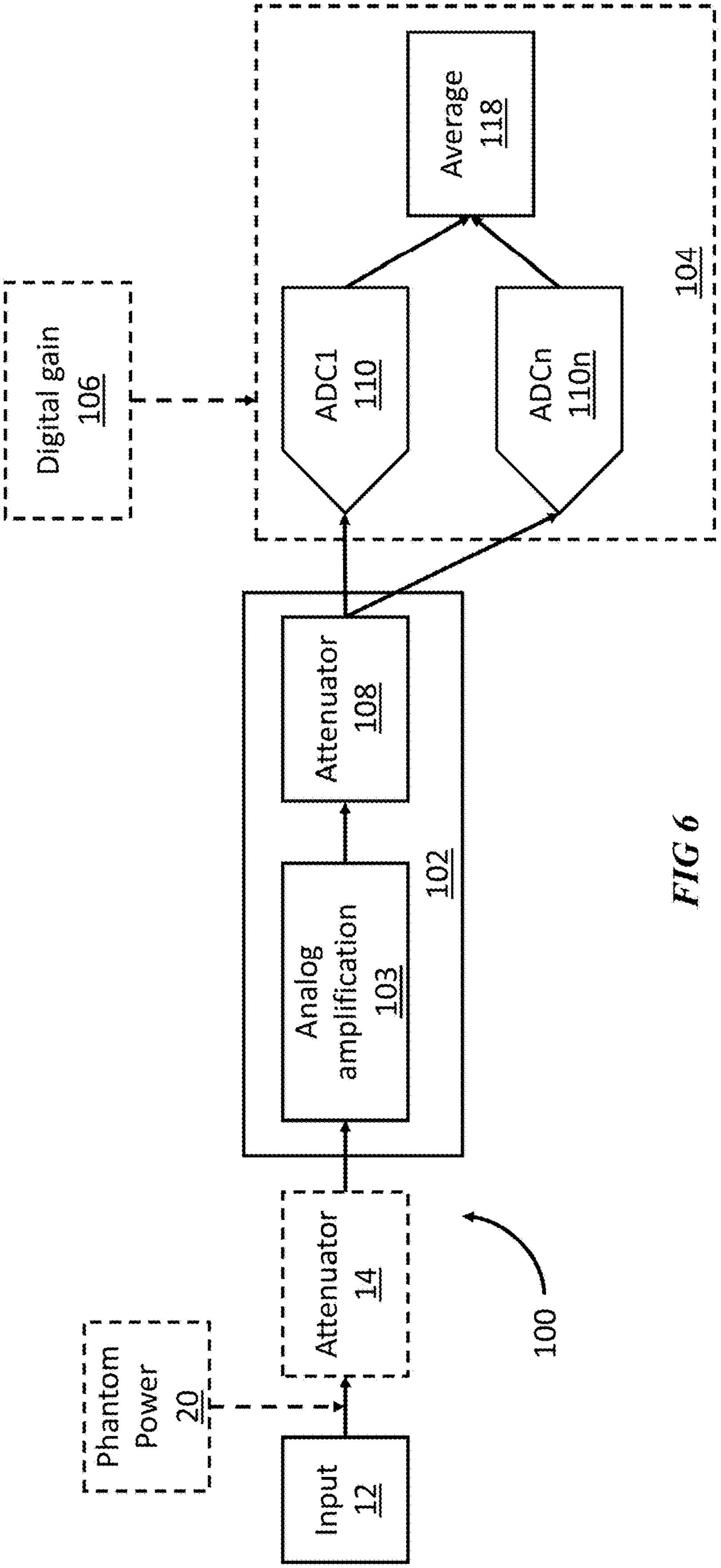
FIG. 6 is a schematic block diagram of an audio processing system of a fourth embodiment.

The output from the analog amplification stage 102 is input to the analog to digital conversion stage 104 for conversion to a digital signal. The analog to digital conversion stage 104, is configured to have a dynamic range (second dynamic range) that matches said first dynamic range of the analog amplification stage 102. In some embodiments the analog to digital conversion stage 104 comprises a plurality of analog to digital converters (ADCs). Each of the ADCs can have a third dynamic range that is lower than the second dynamic range of the overall analog to digital conversion stage 104. The output of the plurality of ADCs can then be digitally averaged to provide a digital output with the second dynamic range. FIG. 6 shows one exemplary embodiment of such an ADC stage 104. In an ADC arrangement operating in this averaging mode, every time the number of ADCs in the analog to digital conversion stage 104 is doubled a 3 dB gain in dynamic range is provided. Thus it is possible to configure the dynamic range of the analog to digital conversion stage 104 (second dynamic range) by increasing or decreasing the number of ADC's included in the averaging process, so that the second dynamic range matches that of the analog amplification stage 102.

Figure 4:
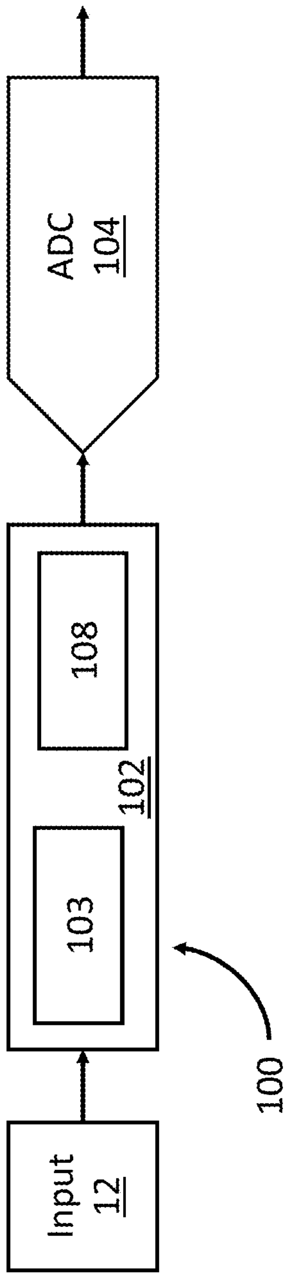
FIG. 4 is a schematic block diagram of an audio processing system of a second embodiment.

It will be appreciated that it is not necessary to conform rigidly to the specifically stated gain and dynamic range values to implement an embodiment of the present disclosure, and to thereby address some of the conventional drawbacks or compromises mentioned above. Moreover, in a practice it may not be possible to adhere exactly to such values. For example, the real world variability of component performance (from nominally specified values) may simply mean that certain embodiments may vary from the expressed parameters. Moreover, a consequential need to provide headroom in certain components to accommodate any such variability may mean that the nominal performance of a specific embodiment varies from the stated parameters. Moreover, "matching" of dynamic ranges need not require precise identity between the dynamic ranges. The downstream dynamic range may be the same as, or exceed that of, the upstream dynamic range, but in some embodiments the downstream dynamic range may be less than the upstream dynamic range but similar enough to it that does not cause unacceptable clipping of the output of the upstream stage. As an example, where the second dynamic range of the ADC stage 104 and the first dynamic range of the analog amplification stage 102 are described as "matching," "matching" in this context broadly encompasses a situation where the second dynamic range of the ADC stage 104 does not cause unacceptable clipping of the output of the analog amplification stage 102, as such the second dynamic range may exceed the first dynamic range, or the second dynamic range may be slightly lower than the first dynamic range (e.g., within 1 dB or 2 dB) of the first dynamic range, in which case clipping may occur, but the extent of it may be acceptable. As will be appreciated, such a situation may occur practically when multiple ADCs are used together in parallel and averaged to set the second dynamic range. As noted above, adding ADCs to the system increases the second dynamic range, but does so in a stepwise manner, so it may not be possible to exactly match the first dynamic range of the upstream analog amplification stage. FIG. 4 shows more detail of an embodiment of the system 100. In this embodiment, the analog amplification stage 102 includes an analog preamp stage 103 having a second fixed gain and analog attenuator stage 108 having a third fixed gain. In this case, the second fixed gain and third fixed gain are combined to provide the first fixed gain.

The analog preamp stage 103 may be a differential amplifier having very low input noise and also low gain. For example, the differential amplifier may include op-amps with input noise of less than 1.5 nV/√Hz. In some examples, the op-amps can have input noise between 1 nV/√Hz and 1.2 nV/√Hz. In one example, the op-amps can have input noise of 1.1 nV/√Hz. For example, a Texas Instruments OPA1612AIDRGR Audio Amplifier would be suitable. Such a preamp stage 103 could have a fixed gain of between 4 and 16 dB. The feedback resistors of the differential amplifier can have a value of between 95Ω and 110Ω and a gain resistor of between 50Ω and 60Ω. One example can have 102Ω feedback resistors and a 56Ω gain resistor. This example will result in the analog preamp stage having a gain of about +13 dB.

Such differential pre-amp provides an equivalent noise input level of −128 dBu and matches the pre-amps equivalent input noise to the ADC 110's noise floor. This preamp can thus provide ultra low input noise and drive the ADCs at full scale. The analog attenuator stage 108's third fixed gain is selected to match the preamp 103's maximum output level to the maximum input level of the paralleled ADCs forming the ADC 110. The analog attenuator stage 108 can have a third gain of −9 db (or other appropriate level between about −5 and −12 dB depending on other system parameters, such as the maximum input level of the paralleled ADCs).

Figure 5:
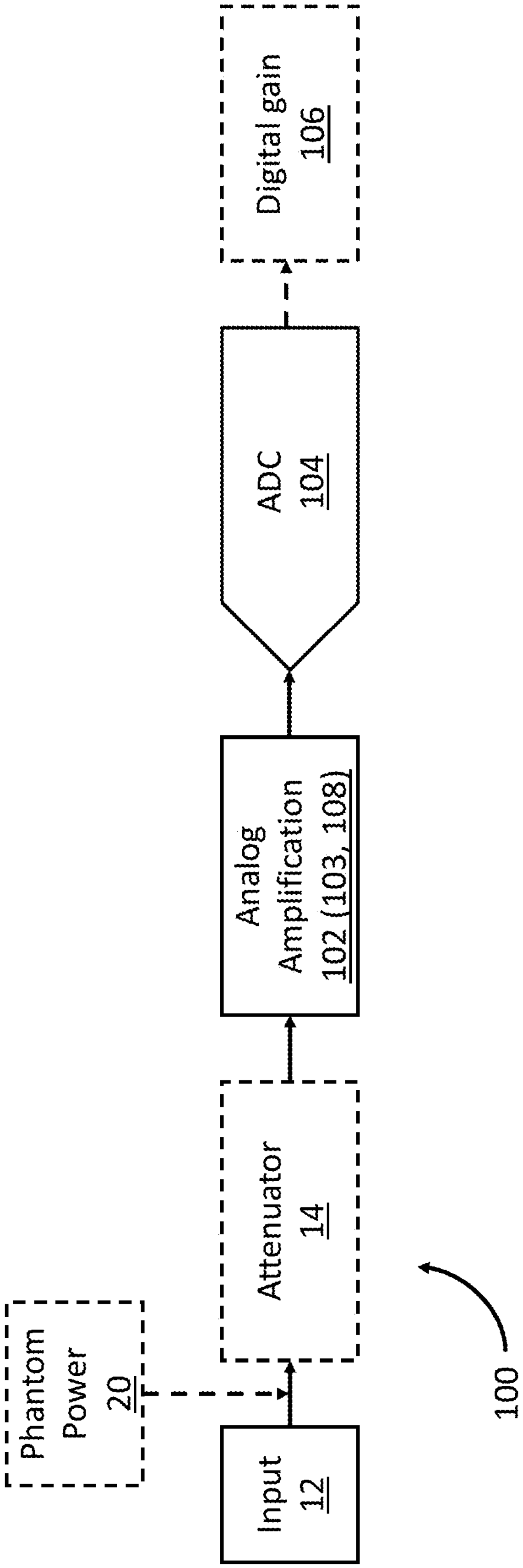
FIG. 5 is a schematic block diagram of an audio processing system of a third embodiment.

In some embodiments, such as that illustrated in FIGS. 5 and 6, the system may also include an analog attenuator stage 14. The analog attenuator stage 14 can be switchable so that it can be selectively connected at a point between the input 12 and the analog amplification stage 102. As noted above in relation to the prior art, such an attenuator 14 provides a fixed reduction in input signal, e.g., a reduction of −20 dB. The attenuator 14 provides a mechanism to allow the system to accept extra high input signal levels from higher output phantom powered microphones or from an instrument or audio line level source.

Optionally, in some embodiments such as that of FIGS. 5 and 6, a phantom power source 20 can also be provided. The phantom power source 20 may be switchable in order to selectively power sources requiring input power. In this example, the phantom power source may be connectable between the input 12 and analog amplification stage 102 to power an input source, e.g., a condenser microphone.

In some embodiments, such as that of FIGS. 5 and 6, the system 100 can include a digital gain stage 106 configured to modify an output of the analog to digital conversion stage and apply a user selectable gain. In some embodiments, the user selectable gain can be static, insofar as it can be set from time to time by a user in the manner of a calibration value or user preference. In some embodiments, the user selectable gain can be dynamically selectable, in that the digital gain is adjustable in real time or near real time. Some embodiments may incorporate both static and dynamic selection of digital gain.

Figure 13:
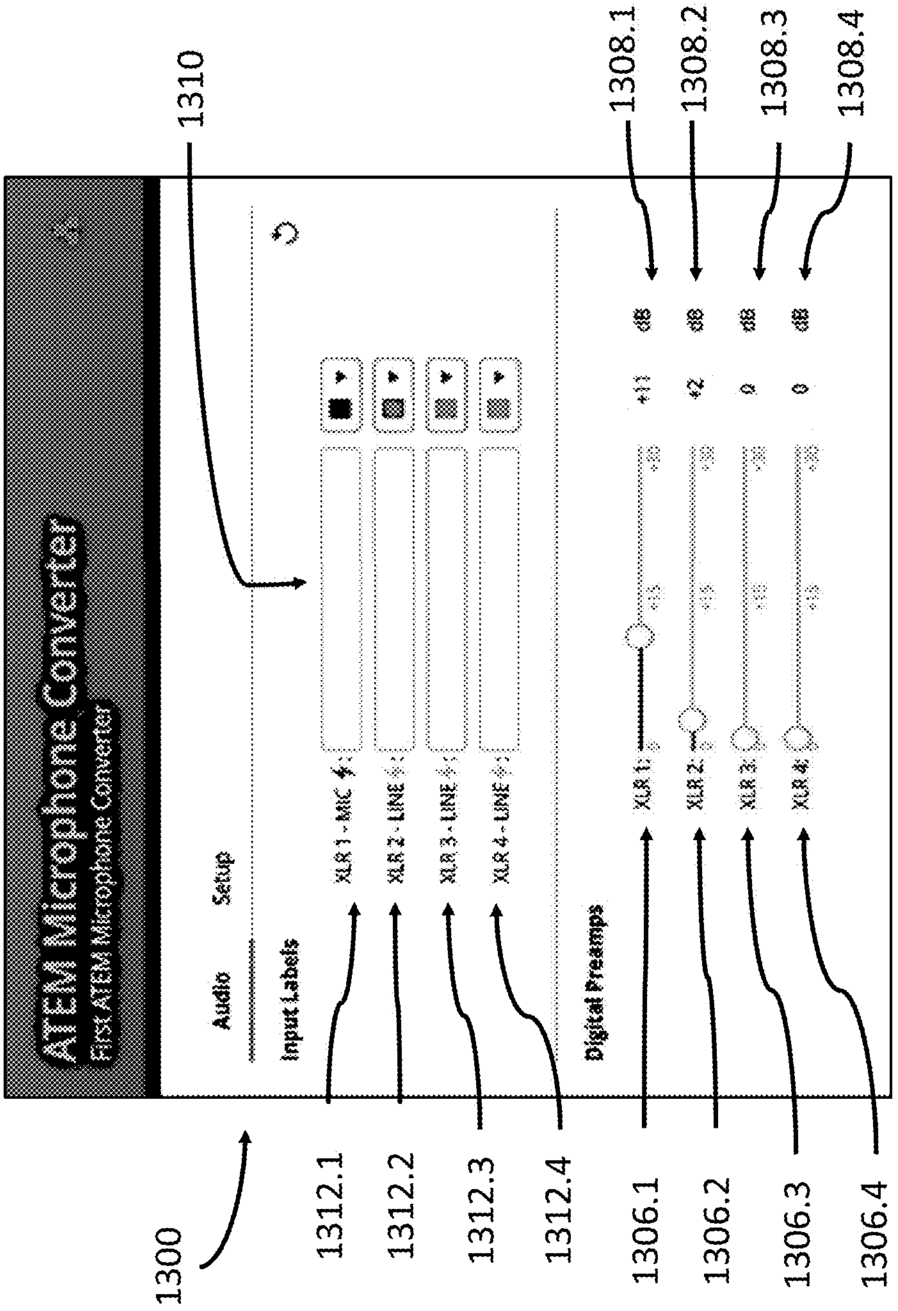
FIG. 13 illustrates a window of a graphical user interface for an embodiment.

In some embodiments, setting the user selectable gain can involve setting a value via an external device (such as a computer, smart phone, tablet or the like running a control application, or a physical control panel, mixer, console) that communicates with the system 100 to set the user selectable gain and optionally other operating parameters. Alternatively, a physical input may be provided as part of the system 100 to set the user selectable gain. An example of a user interface of such an external device is provided in FIG. 13. FIG. 13 shows a graphical user interface of a software control panel implemented as part of a software application running on a user's PC, tablet, phone or other suitable computing device, which may be interfaced with an audio processing system of the present disclosure. The Software application GUI 1300 displays the current parameters of each of 4 channels of an audio processing system of the present disclosure (e.g., 100) at 1312.1, 1312.2, 1312.3, 1312.4 respectively. As can be seen, channel 1 corresponding to the analog input labelled XLR1 (1312.1) is set as "MIC" showing that attenuator 14 is disconnected, and the power symbol is illuminated to indicate that phantom power 20 is activated. For channel 2 corresponding to the analog input labelled XLR2 (1312.2), the attenuator is set for a "Line" level input meaning that attenuator 14 is connected, and the power symbol is not illuminated to indicate that phantom power 20 is inactive. Channels 3 and 4 corresponding to the analog inputs labelled XLR3 and XLR4 respectively (1312.3, 1312.4) are as per 1312.2. The software control panel 1300 also displays, and enables setting of, a digital gain applied to each channel at 1306.1 to 1306.4. Each channel (1 to 4) is provided with a respective gain control 1306.1 to 1306.4, which in this case is in the form of a slider (but could take any useful forms, such as a text box where a gain is able to be entered, or a up/down selection button/s to modify a current level, or buttons allowing selection of preset values, etc.). In use, a user can move the indicator on the slider of respective gain control 1306.1 to 1306.4. The resulting digital gain that is applied to each channel is indicated at 1308.1 to 1308.4. As can be seen, Channel 1 had +11 dB gain applied to it at 1308.1, and channel 2 has +2 dB gain applied to it at 1308.2.

The digital gain stage on each channel may allow a user to vary the level of the output for any purpose, but in a multi-channel system it may be convenient to use a digital gain stage of the audio processing device 100 to compensate for the varying levels of the analog inputs at each channel's input 12. Alternatively, or additionally, amplification can be performed on the digital output signal of each channel at a downstream device connected to the audio processing system 100 of the present disclosure.

In embodiments in which the user selectable gain is dynamically adjustable the gain may be adjusted, inter alia, to account for a varying signal level at the input (e.g., depending on the characteristics of the input device) or to make a change to the output level (e.g., to change output sound level in a live situation, fade up, or fade down). The user selectable gain may be adjustable in substantially imperceptible steps. Generally speaking, the smaller the steps the less perceptible they may be. In some embodiments, the steps may be as small as 0.001 dB. Typically, such steps may be between ±1 and ±0.01 dB. In some embodiments, steps of between ±0.5 and ±0.05 dB may be used. Some embodiments, such as those described in examples herein use ±0.1 db steps. Using such fine adjustment steps (compared to ±1 dB of conventional analog gain adjustment) may be advantageous in reducing or eliminating the perceptible zipper noise discussed above.

In some embodiments, a user may select the digital gain level by a discrete action, e.g., by directly typing a gain value in a GUI's text box, or selection of a gain level input from a list of predefined options (e.g., choosing a value between 1 and 11, selecting a gain level, e.g., hi, med, low). In such situations is might be necessary or desirable to change the digital gain applied from the previous user selected gain level to the newly selected gain value by smoothly ramping between the two values to avoid an abrupt change in gain. In such situations the digital gain can be varied in a predetermined manner, e.g., change in predefined gain steps over a given time period, change according to a predetermined function, e.g., a linear or non-linear function that varies gain over time between the start and end values, or change at a predetermined rate, e.g., measured in steps/second or dB/second.

In some embodiments in which the user selectable gain is dynamically adjustable, the user selectable gain may will change in real time with a user's adjustment of a control. In some embodiments, this change will include receiving a control signal from an external device (such as a computer, smart phone, tablet or the like running a control application, or a physical control panel, mixer, console) that communicates with the system 100 to set the user selectable gain and optionally other operating parameters. For a computer, smart phone, tablet or the like, the user may adjust a control on a graphical user interface, e.g., using a mouse, trackball, touchscreen, touch pad or the like to indicate an adjustment of digital gain. For an external control device (e.g., a physical control panel, mixer, console or the like) an input device such as a control knob, physical slider, or touch screen input may be used to vary the user selectable gain. Alternatively, a physical input may be provided as part of the system 100, e.g., a control knob, physical slider, touch screen input. In such embodiments the control signal may provide changes in steps of between ±1 and ±0.001 dB. In some embodiments, steps of steps of between ±0.5 and ±0.05 dB, such as steps of ±0.1 db may be used. Using such fine adjustment steps (compared to 1 dB of conventional analog gain adjustment) may be advantageous in reducing or eliminating the perceptible zipper noise discussed above.

Figure 15:
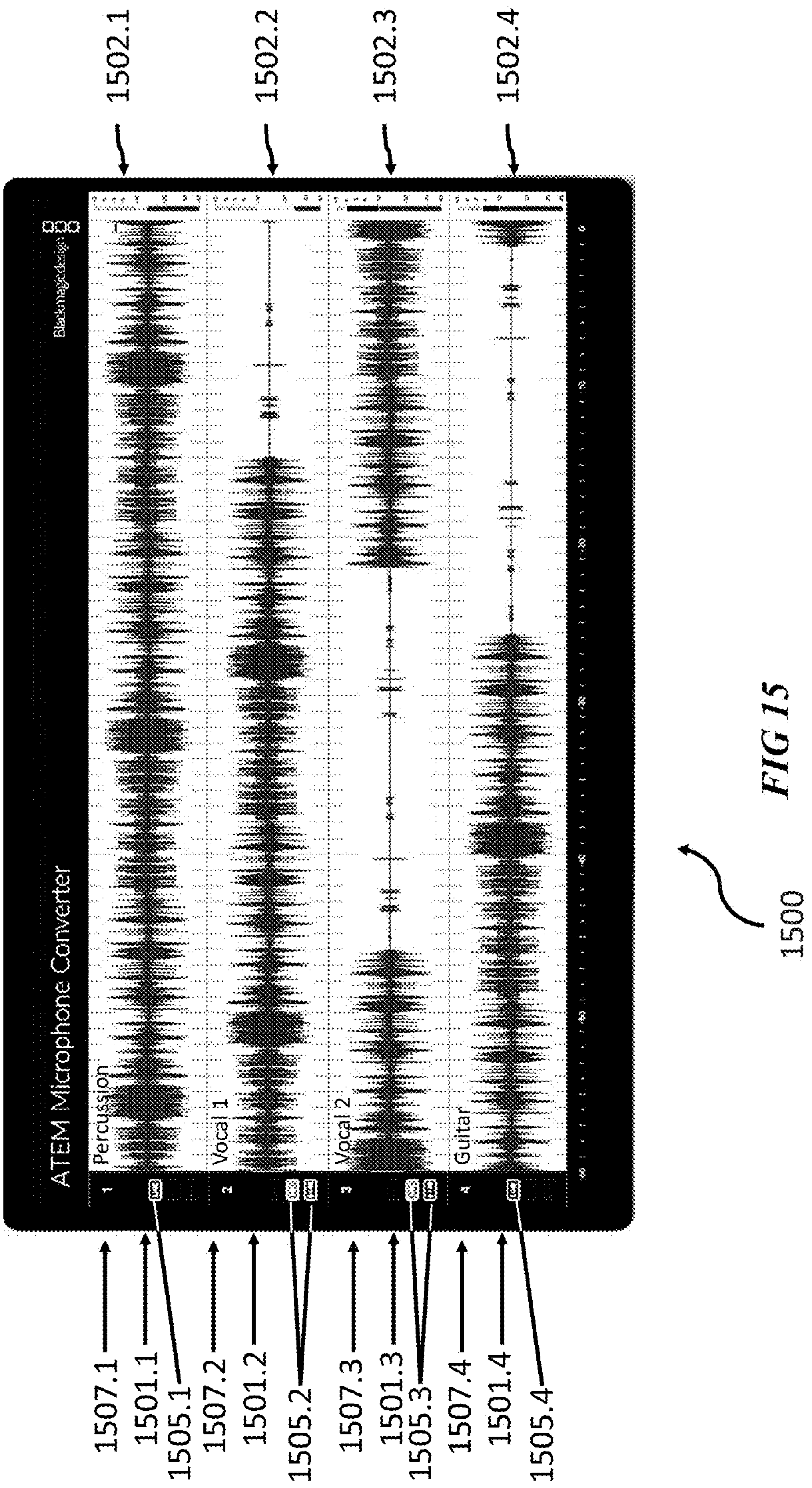
FIG. 15 illustrates a monitoring interface for an embodiment of a four channel audio processing device.

FIG. 6 shows a further embodiment including more details of the ADC stage 104. Features common to earlier embodiments are indicated with matching reference numerals. In this embodiment the Analog to digital conversion stage 104 comprises a plurality of n analog to digital converters (110 to 110*n*)—although for simplicity only 2 are shown. Each ADC 110 . . . 110*n* in the plurality can have a certain dynamic range (third dynamic range). This individual dynamic range will be relatively low compared to the second dynamic range. However, to address this limited dynamic range, an output of the plurality of ADCs 110 . . . 110*n* can be digitally averaged to provide a digital output with the desired second dynamic range. Every time the number of ADCs in the analog to digital conversion stage 104 is doubled a 3 dB gain in dynamic range is provided. Thus it is possible to configure the dynamic range of the analog to digital conversion stage 104 (second dynamic range) by increasing or decreasing the number of ADC's 110 . . . 110*n* included in the averaging process, so that the second dynamic range matches that of the analog amplification stage 102. Averaging 118 can take place in a data processing system of the system 100 or external device to which the digital output is passed. The system may thus include a data processing system configured to further process the output of the ADC stage 104, receive user inputs, and provide output data on different data ports, e.g., the system may include a monitoring interface driven by the data processing system to enable a user to visualize input and or output signals or parameters associated therewith. FIG. 15 illustrates an example of a graphical user interface for monitoring the output of a 4 channel audio processing device according to the present disclosure. The system may also include a MADI, ethernet, USB, HDMI or other data transmission/reception interfaces to interoperate with other systems. Such interfaces also enable reception of control inputs from a user via an external device (such as a computer, smart phone, tablet or the like running a control application, or a physical control panel, mixer, console) that communicates with the system 100 to sets the user selectable gain and optionally other operating parameters.

Figure 7:
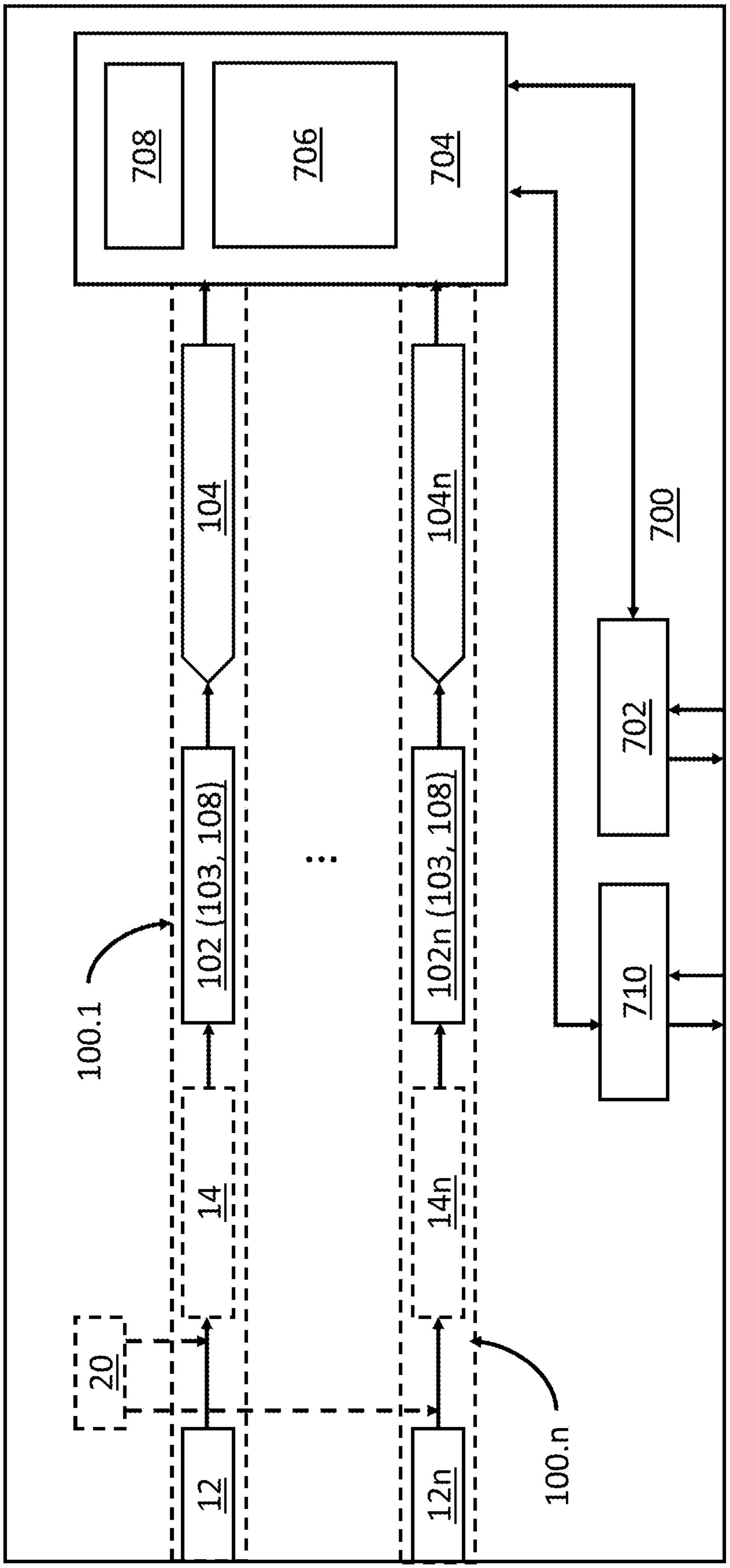
FIG. 7 is a schematic block diagram of an audio processing system of a fifth embodiment.

FIG. 7 illustrates a further embodiment of an audio processing device 700. The audio processing device 700 includes n audio processing systems 100.1, 100.*n* which are generally of the type described in connection with FIGS. 3 and 4. Each audio processing system 100.*n* comprises a channel of the audio processing device 700, and for convenience will be referred to as a "channel" in this description. The device 700 can have any number n of audio processing systems (channels). In some embodiments, n=2, 4, 8, 10, 12, 15 or more channels. The Blackmagic ATEM Microphone Converter illustrated in FIG. 12 is an example of a device where n=4. Each channel 100.*n* includes:

An input 12 for receiving an audio signal. The input may be an XLR socket or other balanced input signal.

An analog amplification stage 102. The audio signal received at the input 12 is passed to an analog amplification stage 102 having a fixed gain. Analog amplification stage 102 may be comprised of an analog preamplifier 103 and an attenuator 108.

An ADC stage 104. The output from the analog amplification stage 102 is input to the analog to digital conversion stage 104 for conversion to a digital signal. The analog to digital conversion stage 104, is configured to have a dynamic range that matches said first dynamic range of the analog amplification stage 102. The analog to digital conversion stage 104 of each channel includes a plurality of analog to digital converters (ADCs). Each of the ADCs can have a third dynamic range that is lower than the second dynamic range of the overall analog to digital conversion stage 104. The output of the plurality of ADCs are digitally averaged to provide a digital output with the second dynamic range by the digital processing system 704. The digital processing system 704 includes a data processing system 706 comprising at least one processor with associated memory 708. The data processing system 706 can include one or more microprocessors, FPGAs, ASIC, DSP, ASSPs or the like which are configured to process digital audio and perform system control operations. In some examples, each channel or groups of channels may have dedicated data processing resources, such as its own microprocessor, FPGA, ASIC, DSP, ASSP for processing the channel or group of channels. In the present example, outputs of the eight ADCs of each channel, are passed to the data processing system 706 for averaging. The data processing system 706 also applies any digital gain set to be applied to each channel as described in connection with FIGS. 5, 6 and 13.

Each channel can additionally include a switchable attenuator 14 to enable the channel to accept "mic" or "line" level input signals. The switchable analog attenuator 14 can provide a selectable fixed reduction in input signal of −20 dB. A phantom power source 20 is also provided, which is switchable in order to selectively power a source requiring input power.

The control of the switchable fixed attenuator 14 or phantom power 20 on each channel can be performed by choosing the settings on a series of hardware switches comprising part of a monitoring and control I/O system 702. In this regard, each channel may be provided with 2 switches one to set the condition of the channel's attenuator 14 and the other to connect or disconnect the phantom power 20 to the channel.

The monitoring and control I/O system 702 may additionally include network connections (e.g., of any one or more suitable wired or wireless connections, such as USB, Ethernet, HDMI, WiFi or Bluetooth connections) for interfacing with other devices to enable control of the audio processing device 700 and/or monitoring the status or operation of the audio processing device 700.

The digital audio output generated by each channel is output via the audio input/output system 710. The audio I/O 710 can comprise a wired or wireless data communication interface configured to send (and optionally receive) digital audio. For example, the audio I/O 710 may include one or more USB, Ethernet, HDMI, WiFi or Bluetooth, MADI interfaces. In one form the audio I/O 710 can include two MADI interfaces, one for sending a digital audio output and one for receiving a digital audio input from another device. In other embodiments, a connection can be used for both the audio I/O 710 and the monitoring and control I/O system 702.

Figure 8A:
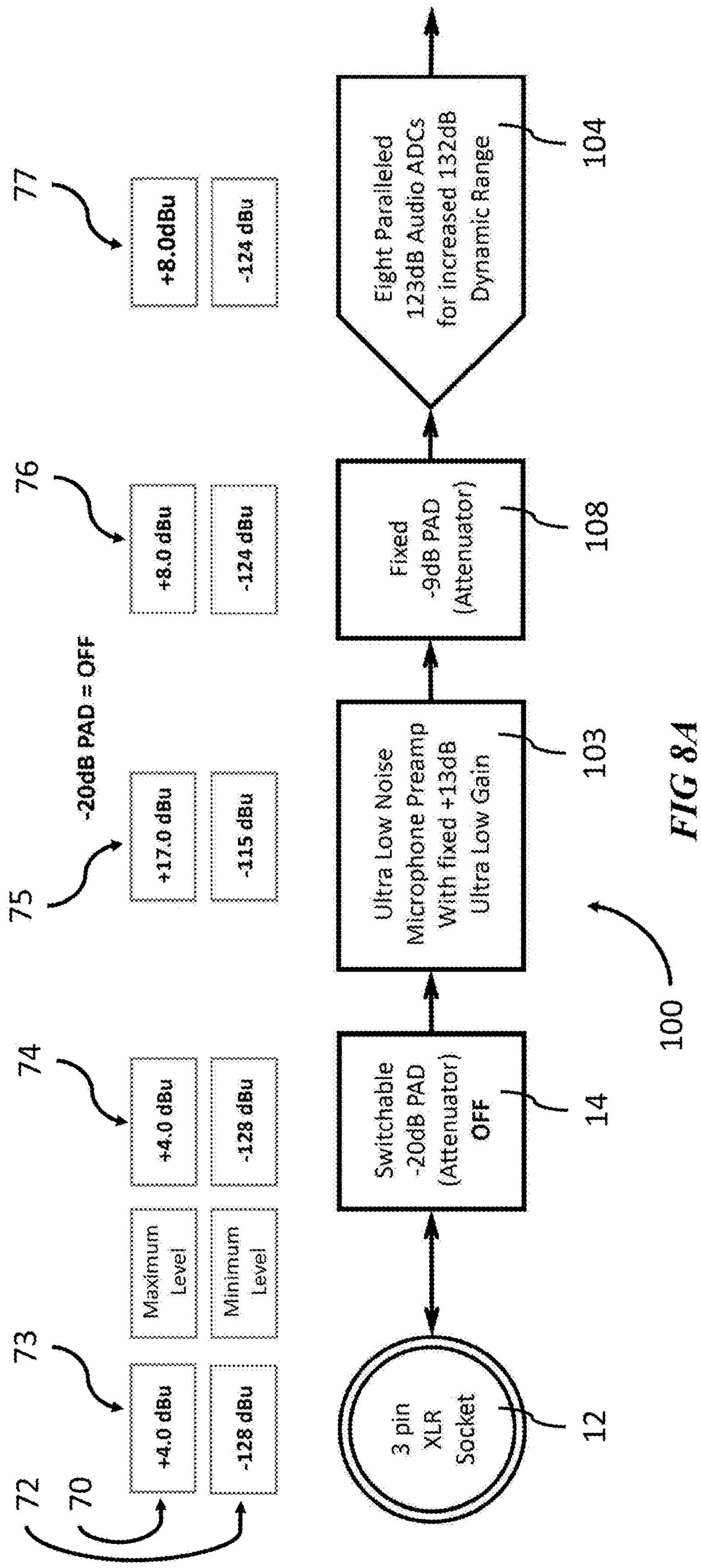
FIGS. 8A and 8B show a schematic block diagram of an audio processing system of an embodiment illustrating system parameters of the embodiment.
Figure 8B:
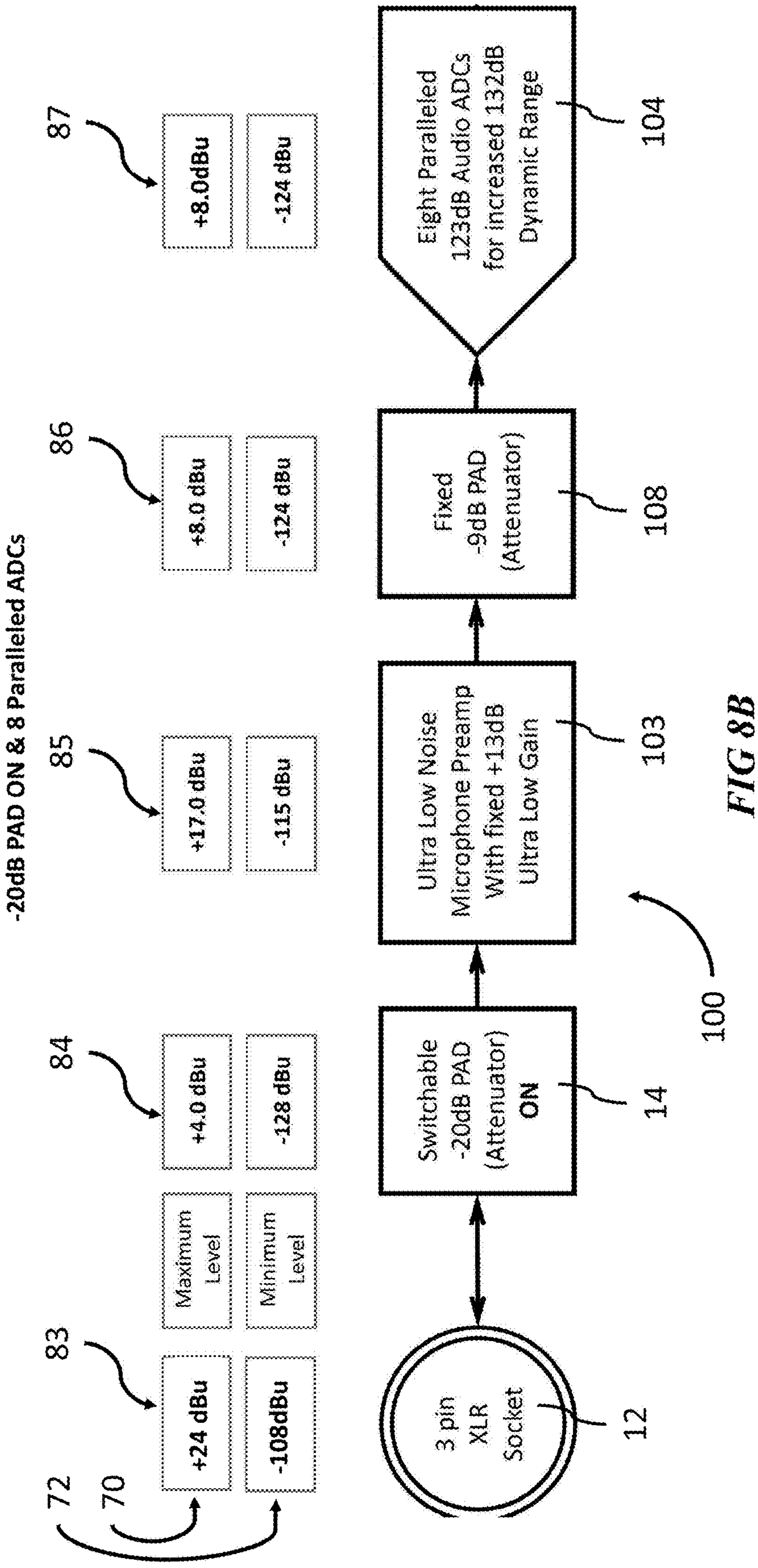
Figure 9:
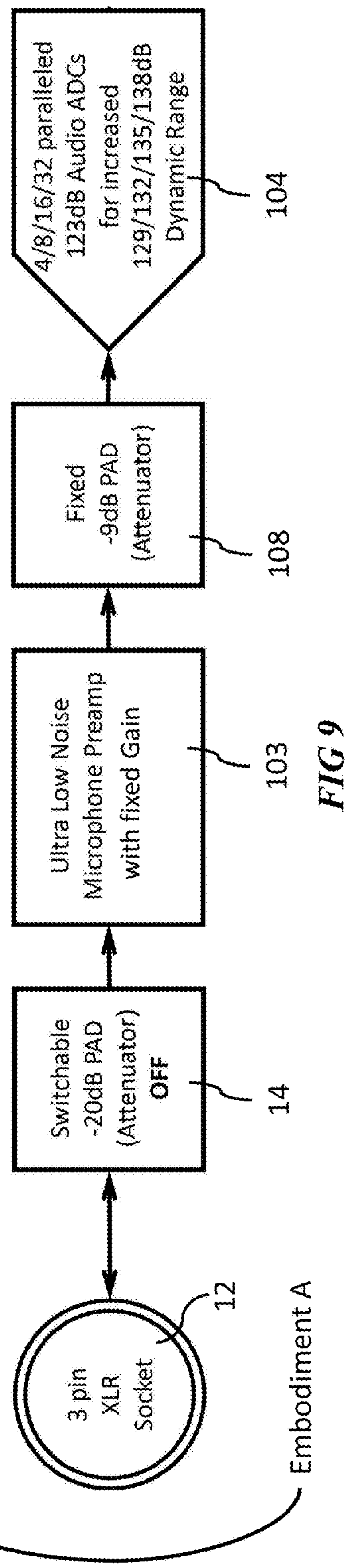
FIG. 9 illustrates 5 additional sets of parameters for five further embodiments.

FIGS. 8A to 9 illustrate block diagrams of an embodiment of a system 100 of the present disclosure. The reference numerals illustrate an equivalence between the blocks of these figures to previous embodiments. FIGS. 8A and 8B illustrate two rows 70 and 72 of operational parameters of this embodiment. Row 70 illustrates the maximum parameter value attainable, whereas row 72 illustrates the minimum value.

In FIG. 8A the switchable attenuator 14 is in the "off" condition, thus a relatively low level input signal is expected. In this example the input signal from the input 12 can have (73) a maximum signal level of 4 dBu and a minimum of −128 dBu. With the attenuator 14 "off" the same values apply 74 at the input to the analog amplification stage 102. The pre-amp stage 103 has a 13 dB gain so its output 75 at maximum signal is 17 dBu, and at minimum is −115 dBu. The fixed attenuator 108 then applies a −9 dB gain and has an output 76 at 8 dBu (maximum signal) and −124 dBu (minimum signal). The ADC 104 has 8 ACDs with a maximum input level of 8 dBu (77) a dynamic range of 123 dB, the output of which is averaged. Thus the total dynamic range of the ADC stage 104 is 132 dB.

In FIG. 8B, the switchable attenuator 14 is in the "ON" condition, thus a relatively high input signal is expected. In this example, the input signal from the input 12 can have (83) a maximum signal level of 24 dBu and a minimum of −108 dBu. With the attenuator 14 "on" the maximum signal level of +4 dBu and minimum of −128 dBu again apply (84) at the input to the analog amplification stage 102. The pre-amp stage 103 has a 13 dB gain so its output 85 at maximum signal is 17 dBu, and at minimum is −115 dBu. The fixed attenuator 108 then applies a −9 dB gain and has an output 86 at 8 dBu (maximum signal) and −124 dBu (minimum signal). The ADC 104 has 8 ACDs with a maximum input level of 8 dBu (87) a dynamic range of 123 dB, the output of which is averaged. Thus the total dynamic range of the ADC stage 104 is 132 dB.

FIG. 9 illustrates the embodiment of FIG. 8A with a data table for different embodiments, illustrating how different numbers of paralleled ADCs (110) in the ADC stage 104 can be used to widen the dynamic range of the overall system, to match different Gain levels at the analog amplification stage 103. Each row 91 to 95 of table 90 represents an embodiment. Embodiment A in row 94 is the embodiment of FIG. 7. As can be seen, the first fixed gain of the analog gain stage 102 (the combination of the gains of stages 103 and 108) varies between −5 dB total to 7 dB total as the number of ADCs range from 64 down to 4. Other variations and embodiments are possible.

Figure 10B:
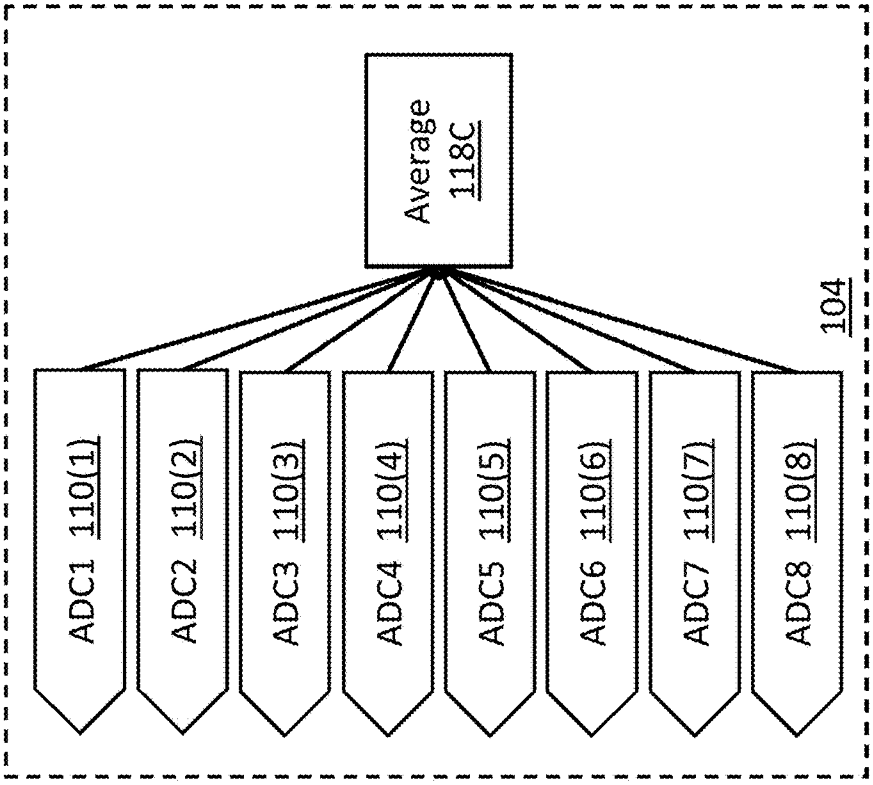
FIGS. 10A, 10B, 11A, and 11B illustrate embodiments of an ADC stage of an embodiment.
Figure 10A:
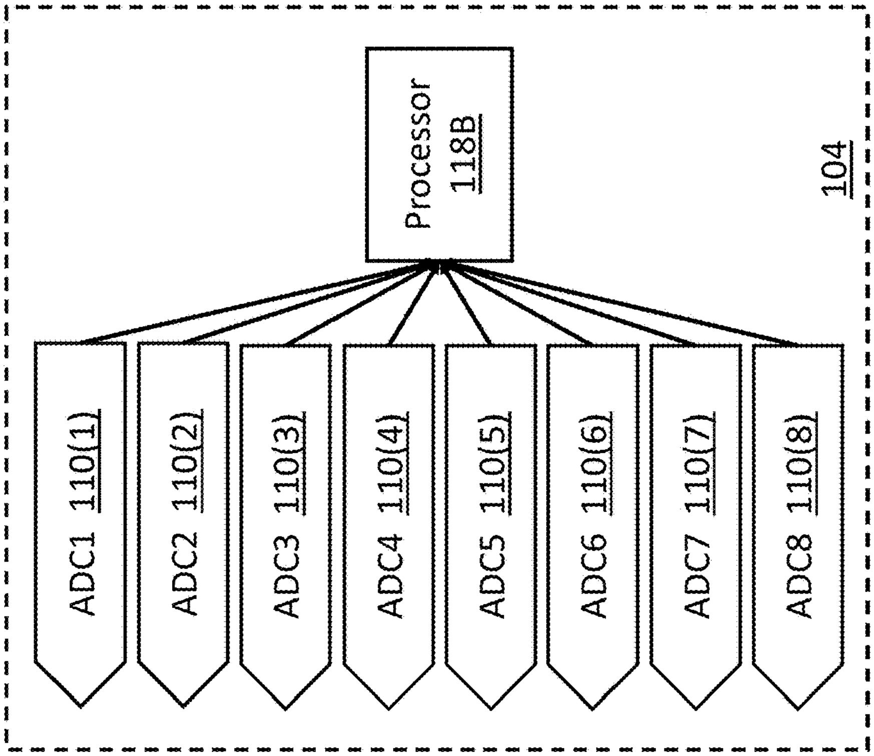
Figure 11B:
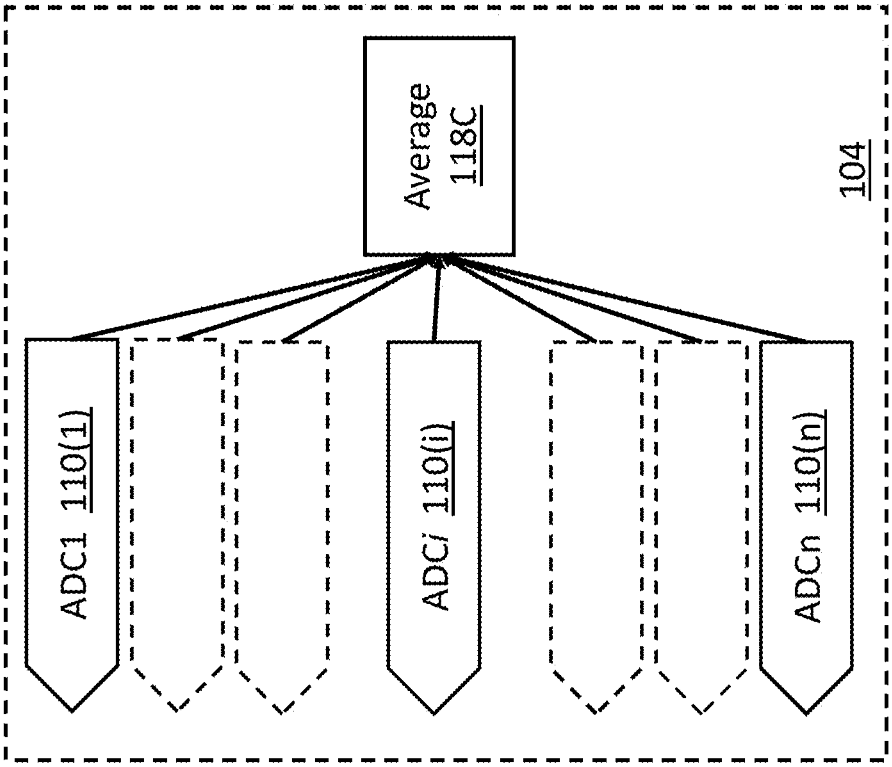
Figure 11A:
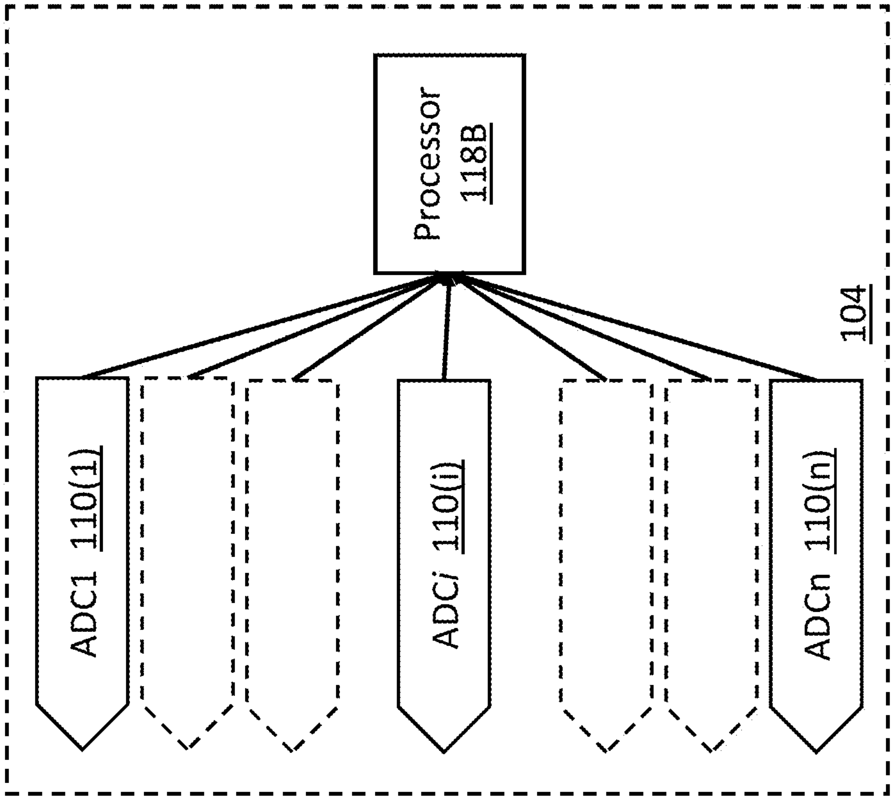

FIGS. 10A and 10B illustrate two examples of an ADC stage 104 that may be used in any of the embodiments disclosed herein (e.g., FIGS. 3 to 9). FIGS. 10A and 10B illustrate an example with 8 ADCs labelled ADC1 (110(1)) to ADC8 (110(8)). The output of each of the ADCs are provided in FIG. 10A to a processor 118B which averages the outputs of all of the ADCs 110(1) to 110(8). The processor 118 B may be the host processor (e.g., microprocessor, FPGA, DSP or the like) of the audio processing system 10, in which case the ADC stage 104 can be considered to encompass a functional grouping of the ADCs and the host processor when implementing this averaging process. FIG. 10B illustrates the case where the averaging is performed as stand-alone averaging stage 118C. The stand alone averaging stage 118C can comprise a digital data processing system including for example a DSP, microprocessor or FPGA. FIGS. 11A and 11B illustrate two further examples of an ADC stage 104 that may be used in any of the embodiments disclosed herein (e.g., FIGS. 3 to 9) these represent a generalization of the examples set out in FIGS. 10A and 10B, and common features are numbered with common reference numerals. In FIGS. 11A and 11B each ADC system 104 includes n ADCs whose n corresponding outputs are grouped together in an average. In FIG. 11A the averaging is performed by a processor 118B which may be host processor (e.g., microprocessor, DSP, FPGA or the like) of the audio processing system 10, in which case the ADC stage 104 can be considered to encompass a functional grouping of the ADCs and the host processor when implementing this averaging process. FIG. 11B illustrates the case where the averaging is performed as stand-alone averaging stage 118C. The stand-alone averaging stage 118C can comprise a digital data processing system including for example a microprocessor DSP or FPGA. FIGS. 8A to 9 give examples of cases where n=4, 8, 16, 32 and 64 but n may equal any other number of ADCs. As noted, it is convenient for n to be a power of 2 as a doubling of the number of ADCs adds 3 dB of dynamic range to the ADC stage 104, but n may be any integer value.

Figure 12B:
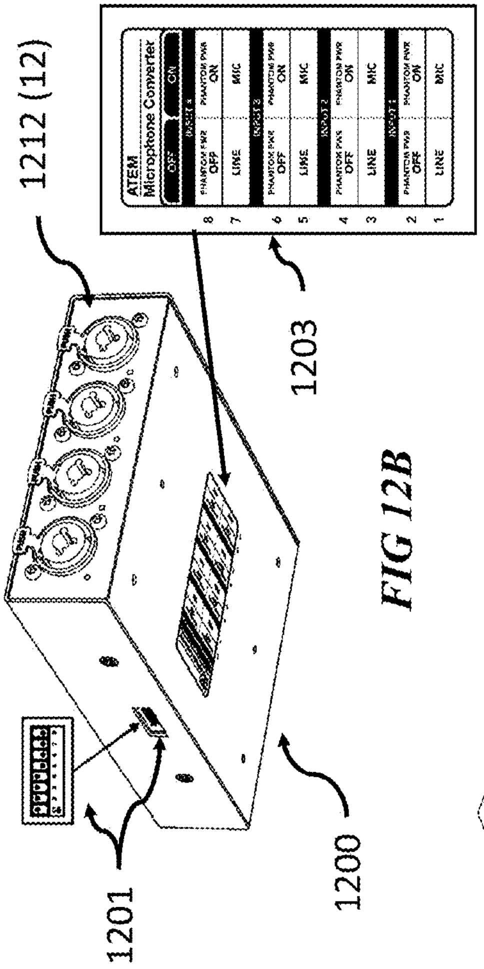
FIGS. 12A, 12B, and 12C illustrate a device made according to an embodiment of the present disclosure.
Figure 12C:
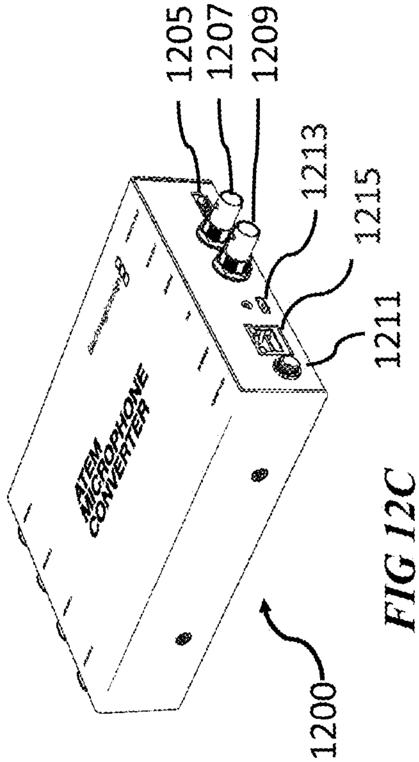
Figure 12A:
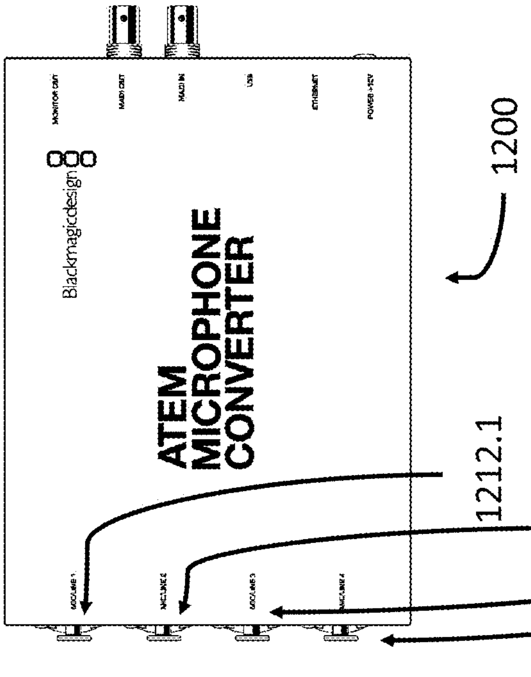

FIGS. 12A to 12C illustrate several views of an example of an implementation of the audio processing system according to the present disclosure, in the form of a Blackmagic ATEM Microphone Converter (1200). The audio processing system 1200 includes 4 signal processing channels, each of which is generally as described in any one of the embodiments of FIGS. 8A to 10. The audio processing system 1200 includes a set of channel inputs on one end thereof. Each of the 4 channels has its own analog input 1212.1 to 1212.4 (equivalent to input 12 in earlier Figs). In this example the inputs, e.g., 1212.1 are a combined XLR/TRS input socket to allow allowing either XLR or jack cables to be connected.

For each channel, the analog input 1212.*i* is "mic" or "line" level selectable by switching the switchable analog attenuator 14 into or out of the channel. Such an attenuator 14 provides a selectable fixed reduction in input signal, e.g., a reduction of −20 dB. A phantom power source 20 is also provided (not shown). The phantom power source 20 is also switchable in order to selectively power sources requiring input power. The control of the switchable fixed attenuator 14 or phantom power 20 on each channel can be performed by choosing the settings on a series of hardware switches (1201). To facilitate this, the bottom of the housing of the audio processing system 1200 shown in FIG. 12B displays a configuration table 1203 which provides a user with a quick reference of how to set the switches for each channel. The switch arrangement 1201 includes two switches per channel to set input level and phantom power, e.g., to set channel 1 to a line level input with phantom power off, the user sets switch 1 to OFF and Switch 2 to OFF. Other configurations are readable from the table 1203.

FIG. 12C shows the other end of the audio processing system which includes:

- a HDMI port 1205 for providing an HDMI monitoring output;
- a MADI output connection 1207 on which the converted digital audio is output for downstream use or processing;

- a MADI input connection 1209 for receiving digital audio.
- a power connection 1211 (e.g., 12V DC) for receiving power to operate the audio processing system 1200;
- a USB port 1213 and Ethernet port 1215 for allowing remote admin and software updates.

Figure 14A:
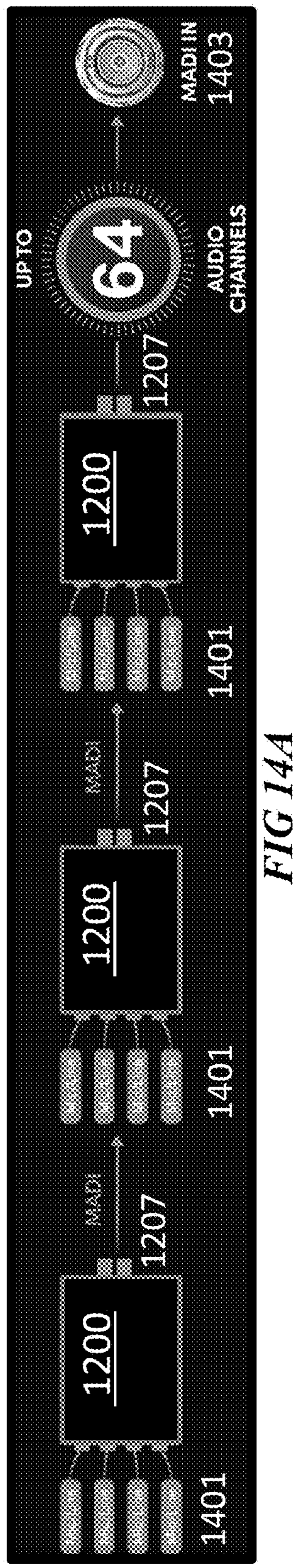
FIGS. 14A and 14B illustrate a scheme for linking of multiple audio processing devices of one embodiment.
Figure 14B:
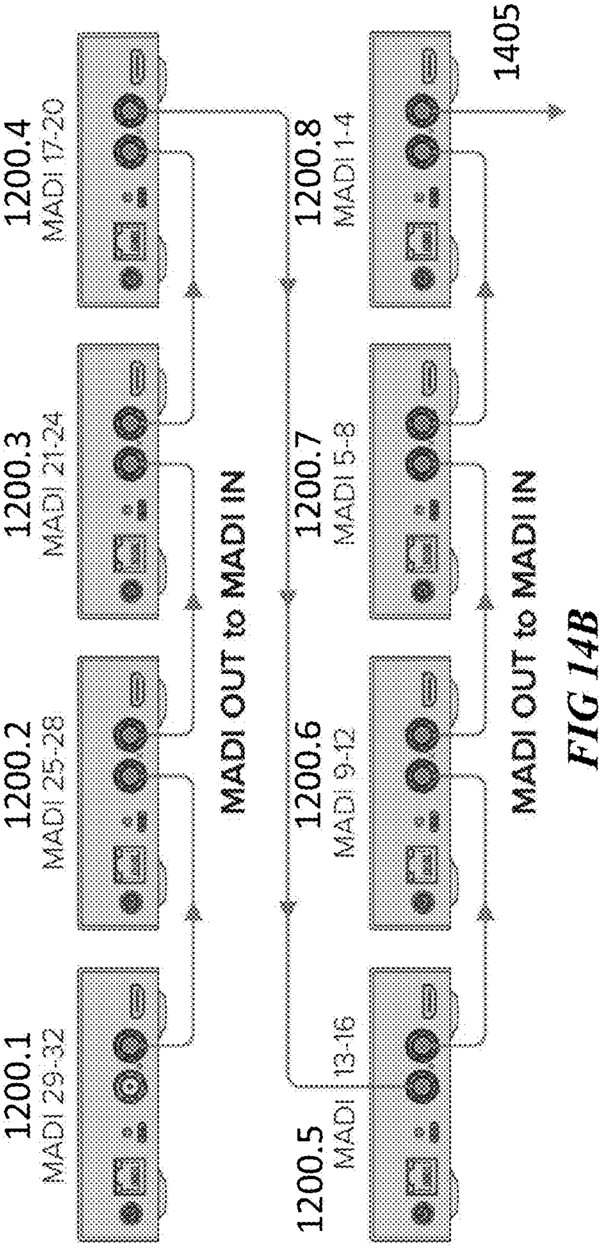

The MADI input connection 1209 allows multiple audio processing devices (e.g., identical devices 1200) to be daisy chained so that more than 4 channels of digital audio can be embedded into the MADI connection. FIGS. 14A and 14B illustrate schematically how in some embodiments the MADI in and out connections, 1209 and 1207, respectively can be used to daisy-chain multiple audio processing devices (1200) in order to increase the number of audio channels being sent over a single data connection for downstream use or processing. The MADI connections are a multi-channel audio link standardized as AES10 by the Audio Engineering Society (AES) and it defines the data format for an interface for multiple channels of digital audio. This may be of use in embodiments of an audio processing device that are currently using (or possess) fewer audio processing channels than a single MADI link is capable of sending simultaneously.

In FIG. 14A, each audio processing device 1200 can have 4 input sources 1401 connected to it as shown. Each processing device 1200 can digitize the analog audio signal on each channel as described above and output its 4 digitized audio output signals in respective channels of its MADI output 1207. If the MADI output is connected to MADI input 1209 of a similar device, the upstream device's MADI output channels are received by the next downstream device and stacked into its MADI feed in addition to its own 4 channels of digital audio data, thus increasing the utilization of the MADI feed. More or fewer audio processing devices 1200 can be connected together in this manner, but in the case of 4 channel audio processing devices 1200 and 48 kHz digital audio outputs up to 16 devices can be linked to receive, convert and output up to 64 channels of digital audio on the final output link 1403. With devices having channels carrying audio at a higher sampling rate, fewer channels of audio and fewer devices can be linked in this manner and still use a single MADI interface.

In a further example, FIG. 14B illustrates the connection of 8 identical audio processing devices daisy chained in this manner to provide 32 channels of digital audio on the one MADI output connection 1405 from the final audio processing device 1200.8. This assumes that each of the devices 1200.1 to 1200.8 have a source connected to each of its 4 inputs and are thus adding 4 channels of digital output to the MADI output.

It should be noted that each audio processing device many have more or fewer audio processing channels (compared to the examples with 4 channels illustrated herein). This in combination with the bit depth and sampling rate of each channel will dictate whether, or how many, such audio processing devices may be daisy chained in this manner.

The HDMI output port 1205 can be used to provide a monitoring output such as that shown in FIG. 15. In use a television or monitor (or other suitable display device) can be connected to the HDMI port 1205 in order to display a status display for one or more channels of audio being processed by the audio processing device 100. The display 1500 includes a scrolling waveform over the last n seconds of time for each channel which is in use. In the example of FIG. 15, a waveform 1501.1 to 1501.4 for each of 4 channels of audio over a 60 second period are shown. The display also includes audio meters such as VU meters 1502.1 to 1502.4 to show the level at the input 12 of each channel. Each channel can also be labelled 1507.1 to 1507.4 with a channel name via the software utility, e.g., using a naming field as shown at 1310 in FIG. 13. There are also indicators for each channel to show the current settings for mic/line input selection and phantom power selection. In this case, Channels 1 and 4 are indicated at 1505.1 and 1505.4 to have a "LINE" level input and no indication that phantom power is on (hence it is inactive); Channels 2 and 3 are indicated at 1505.2 and 1505.3 to have a "MIC" level input and phantom power turned on. In the event multiple devices are connected as discussed above to stack their digital output on the MADI outputs 1207 of the present audio processing device, the monitoring output can be configured to additionally display the additional channels carried on the MADI output.

It should be noted that each audio processing device many have more or fewer audio processing channels (compared to the examples with 4 channels illustrated herein). This in combination with the bit depth and sampling rate of each channel will dictate whether, or how many, such audio processing devices may be daisy chained in this manner.

Figure 16:
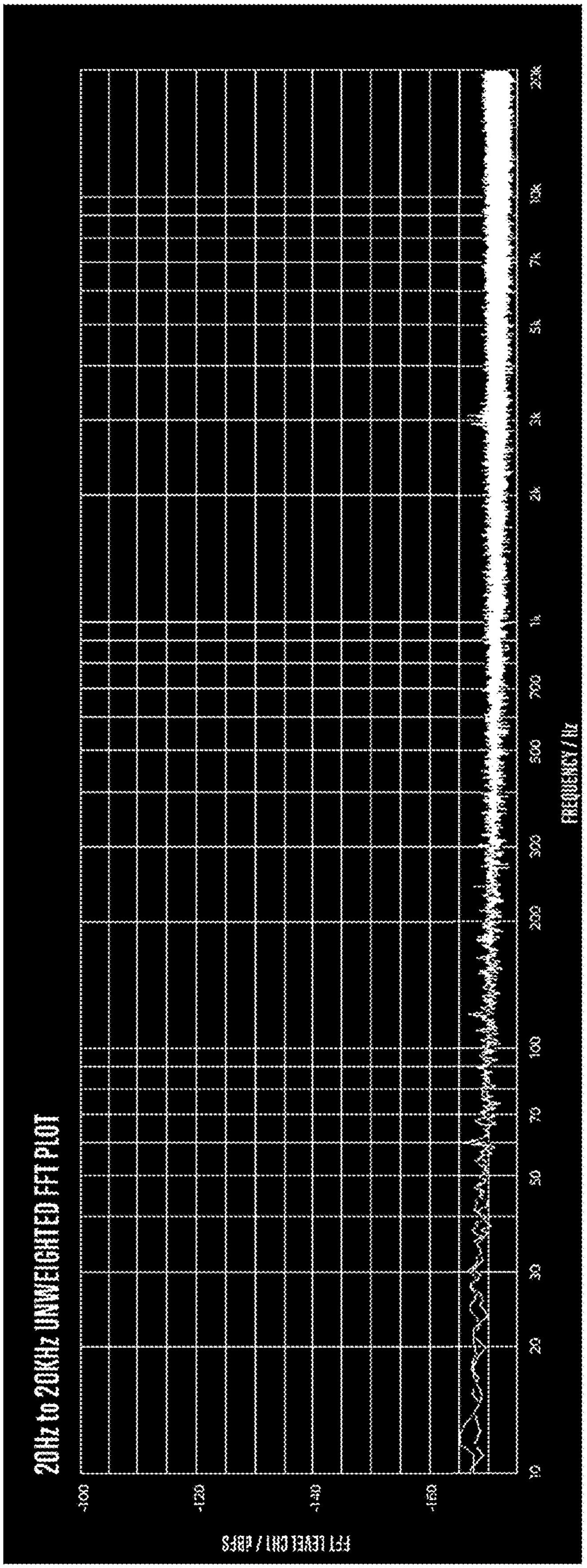
FIG. 16 is a plot of the noise floor of an embodiment in dBFS over the range of 20 Hz to 20 kHz.

In some embodiments of the present disclosure, the use of multiple ADCs per channel as described herein can mean that each channel has very similar specifications and tolerances (due to the averaging process) and as a result each of the channels become statistically more uniform. The multiple ADC design may also maintain a flat noise floor that does not experience the negative effects of noise floor level modulation that conventional designs with staggered ADCs may experience. FIG. 16 illustrates the noise floor between 20 Hz and 20 kHz of an exemplary embodiment of the present disclosure, such as that illustrated in FIGS. 3 to 6. In the illustrated embodiment, the/each analog input channel has a low noise fixed gain preamplifier with a first dynamic range that is arranged to drive a high dynamic range audio ADC with a matching dynamic range. In this example, each ADC has 8 audio ADCs that are averaged to provide a sufficiently high dynamic range to match the first dynamic range. In this way each input channel's dynamic range can be 131 dB (A) with a distortion of only 0.002%. In FIG. 16, one can observe that the noise floor at a spot frequency over a bandwidth of 20 Hz to 20 kHz lies at an average level of approximately to −172 dBFS which equates to approximately-131 dBFS (A) noise floor.

Any definitions expressly provided herein for terms contained in the appended claims shall govern the meaning of those terms as used in the claims. No limitation, element, property, feature, advantage or attribute that is not expressly recited in a claim should limit the scope of the claim in any way.

As used herein the terms "include" and "comprise" (and variations of those terms, such as "including," "includes," "comprising," "comprises," "comprised" and the like) are intended to be inclusive and are not intended to exclude further features, components, integers, or steps.

For aspects of the disclosure that have been described using flowcharts, a given flowchart step could potentially be performed in various ways and by various devices, systems or system modules. A given flowchart step could be divided into multiple steps and/or multiple flowchart steps could be combined into a single step, unless the contrary is specifically noted as essential. Furthermore, the order of the steps can be changed without departing from the scope of the present disclosure, unless the contrary is specifically noted as essential.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. An audio processing system comprising:

an input for receiving a balanced analog audio signal;

an analog amplification stage having a first dynamic range and a first fixed gain between −11 dB and +10 dB;

an analog to digital conversion stage having a second dynamic range that matches said first dynamic range of the analog amplification stage; and a switchable attenuation stage between the input and the analog amplification stage, said switchable attenuation stage being switchable between an active state in which a fixed attenuation of an input signal is provided prior to the analog amplification stage and an inactive state in which the switchable attenuation stage provides no additional attenuation of the input signal prior to the analog amplification stage.

2. The audio processing system as claimed in claim 1, wherein the first fixed gain of the analog amplification stage is between −5 dB and +7 dB.

3. The audio processing system as claimed in claim 1, wherein the first fixed gain of the analog amplification stage is between 4 dB and 5 dB.

4. The audio processing system as claimed in claim 1, wherein the first fixed gain of the analog amplification stage is about 4 dB.

5. The audio processing system as claimed in claim 1, wherein the analog to digital conversion stage comprises a plurality of analog to digital converters (ADCs), each ADC having a third dynamic range that is lower than the second dynamic range, and wherein an output of the plurality of ADCs is digitally averaged to provide a digital output with the second dynamic range.

6. The audio processing system as claimed in claim 1, wherein the analog amplification stage includes:

an analog preamp stage having a second fixed gain; and an analog attenuator stage having a third fixed gain;

wherein the second fixed gain and third fixed gain combine to provide the first fixed gain.

7. The audio processing system as claimed in claim 1, further comprising a digital gain stage configured to modify a digital output of the analog to digital conversion stage and apply a digital gain to the digital output from the analog to digital conversion stage.

8. The audio processing system as claimed in claim 7, wherein the digital gain stage is configured to receive a user selected gain level and apply digital gain to the digital output of the analog to digital conversion stage according to the user selected gain level.

9. The audio processing system as claimed in claim 7, wherein the digital gain stage is configured to receive a user selected gain level and apply digital gain to the digital output of the analog to digital conversion stage that matches the user selected gain level.

10. The audio processing system as claimed in claim 7, wherein the digital gain stage is configured to receive a user selected gain level while operating at an initial digital gain level, and in response to receiving the user selected gain level, to vary a digital gain level applied to the digital output of the analog to digital conversion stage from said initial digital gain level to the user selected gain level.

11. The audio processing system as claimed in claim 10, wherein the digital gain stage is configured to vary the digital gain level applied to the digital output of the analog to digital conversion stage from said initial digital gain level to the user selected gain level using any one or more of the following:

predetermined gain steps;

steps determined at least partly on the difference between the user selected gain level and the initial gain level; or a predetermined variation function.

12. The audio processing system as claimed in claim 7, wherein the digital gain stage is configured to receive a dynamically varying user selected gain level and apply digital gain to the digital output of the analog to digital conversion stage that follows the dynamically varying user selected gain level.

13. The audio processing system as claimed in claim 8, wherein the digital gain stage includes an input device to receive the user selected gain level.

14. The audio processing system as claimed in claim 13, wherein the input device comprises a rotary encoder, one or more buttons, a keyboard, a switch with two or more selectable positions, or a touchscreen adapted to display a gain selection user interface element.

15. The audio processing system as claimed in claim 7, wherein the digital gain stage is configured to adjust the digital gain applied to the digital output of the analog to digital conversion stage in steps less than 1 dB.

16. The audio processing system as claimed in claim 15, wherein the digital gain stage is configured to adjust the digital gain applied to the digital output of the analog to digital conversion stage in steps more than 0.001 dB.

17. The audio processing system as claimed in claim 16, wherein the digital gain stage is configured to adjust the digital gain applied to the digital output of the analog to digital conversion stage in steps smaller than 0.1 dB.

18. The audio processing system as claimed in claim 17, wherein the digital gain stage is configured to adjust the digital gain applied to the digital output of the analog to digital conversion stage in steps larger than 0.005 dB.

19. The audio processing system as claimed in claim 7, wherein the digital gain stage is configured to adjust the digital gain applied to the digital output of the analog to digital conversion stage in steps at or at about 0.01 dB.

20. The audio processing system of claim 1, wherein said input comprises a connector for receiving a connection from a microphone.

21. The audio processing system as claimed in claim 1, further comprising a phantom power source connectable between the input and the analog amplification stage to power an input source.

22. The audio processing system as claimed in claim 1 which comprises at least part of an audio processing system for a channel of a microphone preamplifier.

23. The audio processing system as claimed in claim 22 which comprises at least part of the audio processing system for a channel of a multichannel microphone preamplifier.

24. An audio processing device including at least one audio processing system as claimed in claim 1.

25. An audio processing device as claimed in claim 24 wherein the audio processing device comprises a preamplifier adapted to receive an analog signal from any one or more of the following: a microphone, musical instrument, signal generator, or audio transducer.

26. An audio processing device including at a plurality of audio processing systems as claimed in claim 1, wherein each audio processing system comprises an audio processing channel of the audio processing device.

* * * * *